United States Patent
Meiser et al.

(10) Patent No.: US 9,620,637 B2
(45) Date of Patent: Apr. 11, 2017

(54) SEMICONDUCTOR DEVICE COMPRISING A GATE ELECTRODE CONNECTED TO A SOURCE TERMINAL

(71) Applicant: Infineon Technologies AG, Neubiberg (DE)

(72) Inventors: Andreas Meiser, Sauerlach (DE); Till Schloesser, Munich (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/902,151

(22) Filed: May 24, 2013

(65) Prior Publication Data

US 2014/0346590 A1    Nov. 27, 2014

(51) Int. Cl.
| | | |
|---|---|---|
| H01L 29/76 | (2006.01) | |
| H01L 29/78 | (2006.01) | |
| H01L 29/94 | (2006.01) | |
| H01L 31/113 | (2006.01) | |
| H01L 27/115 | (2006.01) | |
| H01L 21/28 | (2006.01) | |
| H01L 23/48 | (2006.01) | |
| H01L 29/88 | (2006.01) | |

(Continued)

(52) U.S. Cl.
CPC .... *H01L 29/7813* (2013.01); *H01L 29/66204* (2013.01); *H01L 29/66734* (2013.01); *H01L 29/7391* (2013.01)

(58) Field of Classification Search
CPC .......... H01L 29/7827; H01L 29/66666; H01L 29/7813; H01L 29/66734; H01L 29/7802; H01L 29/78; H01L 27/088; H01L 29/7816; H01L 29/792; H01L 29/7811; H01L 29/66883; H01L 29/4236; H01L 29/66712; H01L 27/0629; H01L 29/061
USPC ................................................ 257/225-335
See application file for complete search history.

(56) References Cited

U.S. PATENT DOCUMENTS 5,818,084 A * 10/1998 Williams ............ H01L 27/0727
257/146
2008/0035992 A1    2/2008 Kawaguchi et al.
(Continued)

FOREIGN PATENT DOCUMENTS

DE      102007005636 B4    11/2008
WO           9423457 A1    10/1994

OTHER PUBLICATIONS

Dirk Ahlers. "Gated Diode, Battery Charging Assembly and Generator Assembly." U.S. Appl. No. 13/484,340, filed May 31, 2012.
(Continued)

*Primary Examiner* — Marcos D Pizarro Crespo
*Assistant Examiner* — Nelson Garces
(74) *Attorney, Agent, or Firm* — Murphy, Bilak & Homiller, PLLC

(57) ABSTRACT

A semiconductor device formed in a semiconductor substrate includes a source region, a drain region, a gate electrode, and a body region disposed between the source region and the drain region. The gate electrode is disposed adjacent at least two sides of the body region, and the source region and the gate electrode are coupled to a source terminal. A width of the body region between the two sides of the body region is selected so that the body region is configured to be fully depleted.

10 Claims, 7 Drawing Sheets

(51) Int. Cl.
*H01L 29/66* (2006.01)
*H01L 29/739* (2006.01)

(56) References Cited

U.S. PATENT DOCUMENTS

| | | | |
|---|---|---|---|
| 2008/0164520 A1* | 7/2008 | Darwish | 257/334 |
| 2010/0027787 A1 | 2/2010 | Benkert et al. | |
| 2012/0061753 A1* | 3/2012 | Nishiwaki | 257/331 |
| 2013/0099308 A1 | 4/2013 | Gruber et al. | |

OTHER PUBLICATIONS

Andreas Meiser. "Semiconductor Device Including a Fin and a Drain Extension Region and Manufacturing Method." U.S. Appl. No. 13/692,462, filed Dec. 3, 2012.

Andreas Meiser. "Semiconductor Device and Method of Manufacturing a Semiconductor Device." U.S. Appl. No. 13/731,380, filed Dec. 31, 2013.

Till Schloesser. "Semiconductor Device and Method for Manufacturing a Semiconductor Device." U.S. Appl. No. 13/627,215, filed Sep. 26, 2012.

Andreas Meiser. "Semiconductor Device and Method of Manufacturing a Semiconductor Device." U.S. Appl. No. 13/692,059, filed Dec. 3, 2012.

* cited by examiner

SEMICONDUCTOR DEVICE COMPRISING A GATE ELECTRODE CONNECTED TO A SOURCE TERMINAL

BACKGROUND

In the field of automotive applications and automotive circuitry, standard pn diodes are used for rectifying a voltage generated by an electric generator. Due to this rectification, power losses take place. The power losses are given by the product of the forward voltage and the average current generated by the electric generator. Due to the largely increased need of electrical current, the electric generator is one of the greatest source of power losses in a car. In order to reduce these losses, efficient diodes, so-called high efficiency diodes are being searched for. One possibility of reducing the power losses is by reducing the forward voltage.

A further demand to be met by generator diodes is their breakdown voltage in a case of a load dump. In order to protect electric components in the car, the diodes have to dissipate the entire energy generated by the electric generator in a certain voltage window.

A constraint while reducing the forward current are the demands with regard to the leakage current since the battery must not be discharged by the diode.

SUMMARY

According to an embodiment, a semiconductor device in a semiconductor substrate comprises a source region, a drain region, a gate electrode, and a body region disposed between the source region and the drain region. The gate electrode is disposed adjacent at least two sides of the body region, and the source region and the gate electrode are coupled to a source terminal. A width of the body region measured between the two sides of the body region is selected so that the body region is configured to be fully depleted.

According to a further embodiment, an integrated circuit comprises a first semiconductor device formed in a semiconductor substrate. The semiconductor device comprises a source region, a drain region, a gate electrode, and a body region disposed between the source region and the drain region. The source region is disposed adjacent to a first main surface of the semiconductor substrate, the drain region is disposed adjacent to a second main surface of the semiconductor substrate, and the body region extends in a direction intersecting the first main surface. The gate electrode is disposed in trenches arranged in the first main surface, and the body region is disposed between adjacent trenches. The source region and the gate electrode are coupled to a source terminal. A distance between adjacent trenches is such that the body region is configured to be fully depleted.

According to an embodiment, a method of manufacturing a semiconductor device in a semiconductor substrate comprises: forming a source region, a drain region and a gate electrode; and forming a body region between the source region and the drain region. Forming the gate electrode is accomplished so that the gate electrode is disposed adjacent at least two sides of the body region, and a width of the body region measured between the two sides of the body region is selected so that the body region is configured to be fully depleted. The method further comprises coupling the source region and the gate electrode to a source terminal.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

Figure 1:
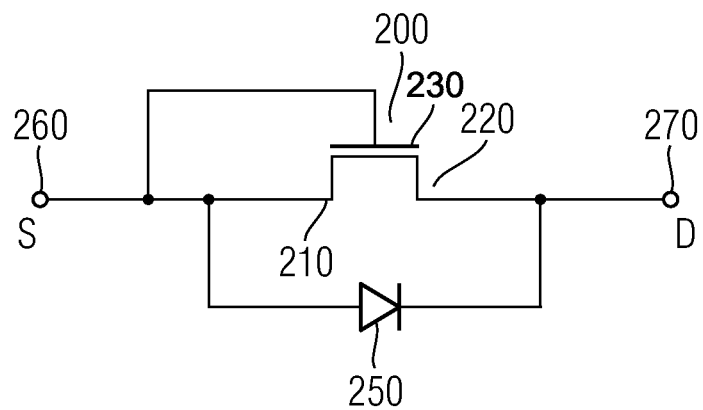
FIG. 1 shows an equivalent circuit diagram of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

FIG. 1 shows an equivalent circuit of a semiconductor device according to an embodiment. The semiconductor device of FIG. 1 comprises a transistor 200 including a source region 210, a drain region 220 and a gate electrode 230. A source terminal (S) 260 is connected with the source region 210. A drain terminal (D) 270 is connected with the drain region 220. A current between the source region 210 and the drain region 220 is controlled by the gate electrode 230. The gate electrode 230 is connected with the source terminal 260. Generally, the transistor 200 is implemented by a MOSFET ("metal oxide semiconductor field effect transistor"). Accordingly, the gate electrode 230 is disposed adjacent to a semiconductor body (not shown in FIG. 1), the gate electrode 230 being insulated from the body by a gate dielectric (also not shown in FIG. 1). When a voltage larger than a threshold voltage is applied to the gate electrode 230, a conductive channel is formed between the source region 210 and the drain region 220 and the transistor is in a conductive state. At a gate voltage smaller than the threshold voltage, a sub-threshold current, which is dominated by diffusion, flows. By controlling the gate voltage, the current from the source region 210 to the drain region 220 via the body region can be controlled.

Generally, the source terminal 260 is further connected via a diode 250 to the drain terminal 270. When a voltage larger than a forward voltage is applied to the diode 250 in an appropriate polarity, a current flows from the source terminal 260 to the drain terminal 270. At a voltage smaller than the forward voltage, no current flows. When a reverse voltage is applied to the diode 250, a current flow is blocked and no current flows from the drain terminal 270 to the source terminal 260.

According to the configuration shown in FIG. 1, since the source terminal 260 is also connected with the gate electrode 230, a current flows from the source terminal 260 to the drain terminal 270 even when a voltage smaller than the forward voltage is applied between the source terminal 260 and the drain terminal 270. According to an embodiment, the transistor 200 is implemented as a FinFET i.e. a transistor in which the gate electrode 230 is adjacent to at least two sides of the body region. According to an embodiment, the FinFET or transistor may be implemented as a "fully depleted" transistor in which a width of the body region measured between the two sides is selected so that the body region is configured to be fully depleted. For example, the body region may be fully depleted at a gate voltage larger than $V_T$. For example, the width of the body region may be selected so that at a certain gate voltage, for example a gate voltage larger than $V_t$, the depletion zones, which are formed at each side of the body region at an interface to a gate dielectric and a gate electrode, contact each other. As a consequence, the transistor may be fully depleted.

Such a fully depleted FinFET has an increased sub-threshold slope, i.e. a ratio of $\Delta I_D/\Delta V_D$ at $V_g<V_T$ that is increased with respect to a non-fully depleted FinFET. At a reverse voltage, the body diode is in a blocking state. Since in a MOS gated diode, the gate electrode is connected with the source terminal, the reverse voltage is also applied to the gate electrode. Due to the increased sub-threshold slope, the drain-source current is blocked more efficiently. In transistors in which the body region is not fully depleted, leakage currents can be prevented by increasing the threshold voltage. In the semiconductor device according to the embodiment, since the body region has the width so that the body region may be fully depleted, due to the increased sub-threshold slope, the leakage current can be suppressed even at a low threshold voltage. Due to the low threshold voltage, the forward voltage of the semiconductor device is decreased, resulting in a reduced power loss during operation.

Accordingly, the present embodiment enables a rectifying diode which can be operated at reduced forward voltages.

According to embodiments, the semiconductor device including the transistor 200 may be implemented by a lateral FinFET, i.e. a FinFET in which the body region, in particular, the conductivity of which is controlled by the gate electrode, extends parallel to a first main surface of the semiconductor substrate. For example, the body region may be disposed in a ridge that is formed in the first main surface of the semiconductor substrate.

According to a further embodiment, the transistor may also be implemented by a vertical FinFET in which the body region, in particular, the conductivity of which is controlled by a gate electrode extends perpendicularly with respect to a main surface of the semiconductor substrate.

Figure 2A:
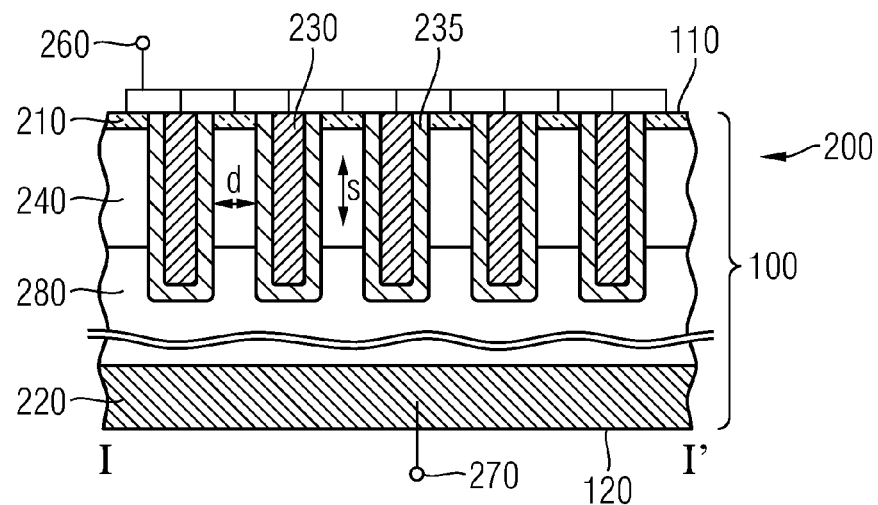
FIGS. 2A to 2C show various views of a semiconductor device according to an embodiment.

FIG. 2A shows a cross-sectional view of a semiconductor device according to this embodiment. The cross-sectional view of FIG. 2A is taken between I and I' as is, for example, illustrated in FIG. 2B. The semiconductor device 200 is formed in a semiconductor substrate 100. The semiconductor device 200 comprises a source region 210, a drain region 220 and a gate electrode 230. A body region 240 is disposed between the source region 210 and the drain region 220. The source region 210 and the drain region 220 are doped with dopants of a first conductivity type (for example, n-type) and the body region 240 is doped with dopants of the second conductivity type (for example, p-type). The gate electrode 230 is disposed adjacent to at least two sides of the body region 240. The source region 210 and the gate electrode 230 are coupled to a source terminal 260. According to the embodiment of FIG. 2A, the source region 210 is disposed adjacent to a first main surface 110 of the semiconductor substrate 100, and the drain region 220 is disposed adjacent to a second main surface 120 of the semiconductor substrate 100. The body region 240 extends in a direction intersecting the first main surface 110.

According to an embodiment, a distance d between adjacent trenches or a width d of the body region, measured perpendicularly with respect to the gate electrode, fulfills the relationship: $d<2*l_d$, wherein $l_d$ denotes a maximum length of a depletion zone formed at the interface between the gate dielectric layer 235 and the body region 240. For example, the length of the depletion zone may be determined as:

$$l_d = \sqrt{\frac{4\varepsilon_s kT \ln(N_A/n_i)}{q^2 N_A}} \quad (1)$$

wherein $\varepsilon_s$ denotes the permittivity of the semiconductor material (e.g. $11.9 \times \varepsilon_0$ for silicon, where $\varepsilon_0 = 8.85 \times 10^{-14}$ F/cm), k denotes the Boltzmann constant ($1.38066 \times 10^{-23}$ J/k), T denotes the temperature, ln the denotes the natural logarithm, $N_A$ denotes the impurity concentration of the semiconductor body, $n_i$ denotes the intrinsic carrier concentration (e.g. $1.45 \times 10^{10}$ cm$^{-3}$ for silicon at 27° C.), and q denotes the elementary charge ($1.6 \times 10^{-19}$ C).

Generally, it is assumed that in a transistor the length of the depletion zone at a gate voltage corresponding to the threshold voltage corresponds to the maximum length of the depletion zone. For example, the distance between adjacent trenches may be approximately 20 to 120 nm, for example, 50 to 100 nm. According to further embodiments, the width of the body region 240 may be much smaller than the double of the maximum length of the depletion zone, for example: $d<1.5*l_d$ or less.

In conventional MOSFETs, in which the body region is not fully depleted, it is necessary to reduce the thickness of the gate dielectric layer to, for example, 7.5 nm or 4 nm, in order to attain a desired sub-threshold slope. As has been mentioned above, in a FinFET in which the body region is fully depleted at an appropriate gate voltage that is, for example, larger than $V_T$, an optimum sub-threshold slope is achieved. In particular, the sub-threshold slope and $V_T$ are independent of a thickness of the gate dielectric layer. Hence, it is not necessary to reduce the thickness of the gate dielectric layer in order to improve the device characteristics. For example, it has been shown that the gate dielectric layer may have a thickness of approximately 20 to 30 nm, for example 25 nm. As a result, it is possible to implement the semiconductor device comprising a transistor having a gate dielectric layer having a thickness which is usually employed in power devices. Hence, it is possible to integrate the semiconductor device of the present embodiments with further semiconductor devices, the further semiconductor devices and the semiconductor device of the present embodiments having the same thickness of the gate dielectric layer. As a consequence, the process of manufacturing an integrated circuit may be further simplified.

Moreover, the ratio of a length s of the body region 240 to width d of the body region 240 may fulfill the following relationship: s/d>2.0. The length s of the body region 240 corresponds to the extension length of the body region 240 parallel to the gate electrode 230. According to further embodiments, s/d>2.5.

According to the embodiment in which the above relationship of the channel length in dependence from the distance d is fulfilled, short channel effects may be efficiently suppressed, resulting in improved device characteristics. Further, when the semiconductor device 200 is used as a diode in which the source region 210 and the gate electrode 230 are connected with a source terminal 260, the forward voltage of the diode can be reduced, whereby the power losses may be further reduced.

According to the embodiment of FIG. 2A, the semiconductor device 200 may further comprise a drain extension region 280 which may be doped with dopants of the first conductivity type. Due to the presence of this drain extension region 280, the semiconductor device 200 may be operated at higher voltages.

Figure 2B:
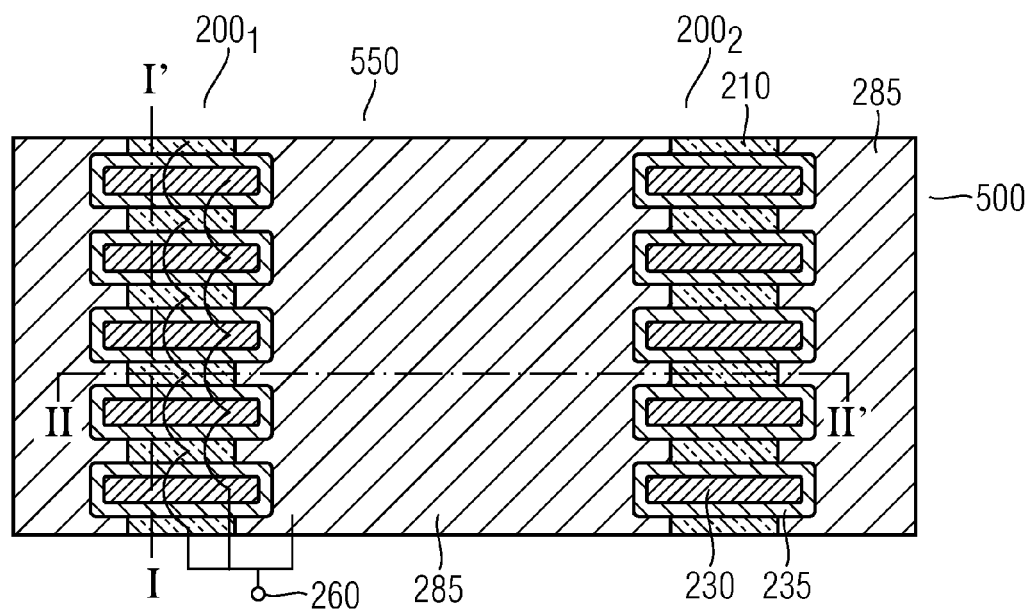

FIG. 2B shows a plan view of a semiconductor device 550 including the transistor 200$_1$ which is, for example, illustrated in FIG. 2A. FIG. 2B further illustrates an integrated circuit 500 comprising a first transistor 200$_1$. The integrated circuit 500 may further comprise a second transistor 200$_2$ having the same construction as the first transistor 200$_1$. Nevertheless, according to a further embodiment, the integrated circuit 500 may comprise further semiconductor devices. A contact portion 285 is disposed between the first and the second transistors 200$_1$, 200$_2$. For example, the contact portion 285 may be doped with dopants of the second conductivity type.

Figure 2C:
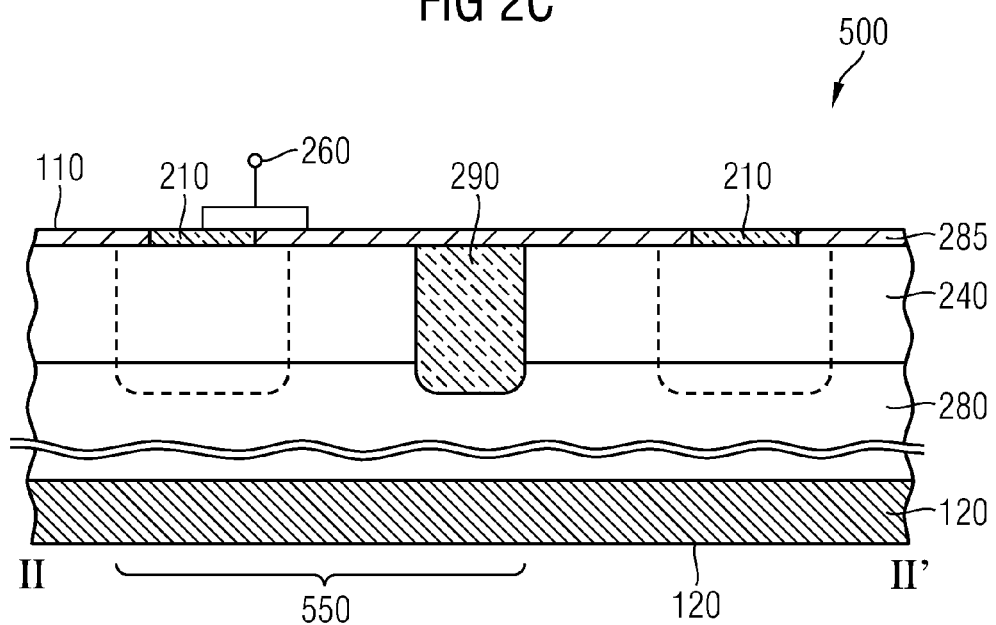

FIG. 2C shows a cross-sectional view of the semiconductor device 550 and of the integrated circuit 500 shown in FIG. 2B. The cross-sectional view of FIG. 2C is taken between II and II' as is also illustrated in FIG. 2B. As is illustrated in FIG. 2C, in the shown cross-sectional view, the body region 240 is formed as a continuous layer over the drain extension region 280. In a direction perpendicular to the illustrated cross-sectional view, a plurality of gate electrodes 230 are disposed, as is indicated by dotted lines. A source region 210 is formed adjacent to the first main surface 110. A contact portion 285 is disposed adjacent to the source region 210. The contact portion 285 forms a contact to the body region 240 of the transistor 200. The source 210 and the contact portion 285 are connected with the source terminal 260. Accordingly, the body diode which is formed by the body region 240 of the second conductivity type and the drain region 120 of the first conductivity type, is connected in parallel with the transistor 200 illustrated, for example, in FIG. 2A so as to implement the circuit shown in FIG. 1.

The semiconductor device further may comprise a clamping portion 290 comprising a doped portion of the second conductivity type at a higher doping concentration than the doping concentration of the body region 240. In case of a high reverse voltage, a breakdown of the semiconductor device may take place via the clamping portion 290. As a result, the current flows across the clamping region 290 without damaging further components of the semiconductor device 550 such as, for example, the gate electrode 230. For example, the clamping portion 290 may be disposed at a lateral distance from the transistor 200, so that the incorporation of hot carriers at the interface between the body region 240 and the gate dielectric 235 may be avoided. Generally, the clamping region 290 may be implemented by a heavily doped region disposed in a correspondingly doped region of the first or second conductivity type, respectively. For example, as is illustrated in FIG. 2C, the clamping region 290 may be doped with dopants of the second conductivity type and may extend from the contact portion 285 to the region 280 of the first conductivity type. According to an embodiment, the clamping portion 290 does not extend to the region 280 of the first conductivity type. According to a further embodiment, the clamping portion 290 does not extend to the contact portion 285. According to a further embodiment, the clamping portion 290 may be doped with dopants of the first conductivity type and may extend from the contact portion 285 to the region 280 of the first conductivity type in a similar manner as shown in FIG. 2C. According to a further embodiment, the clamping portion 290 of the first conductivity type may be disposed within the region 280 of the first conductivity type without extending to the body region 240 of the second conductivity type.

Figure 3A:
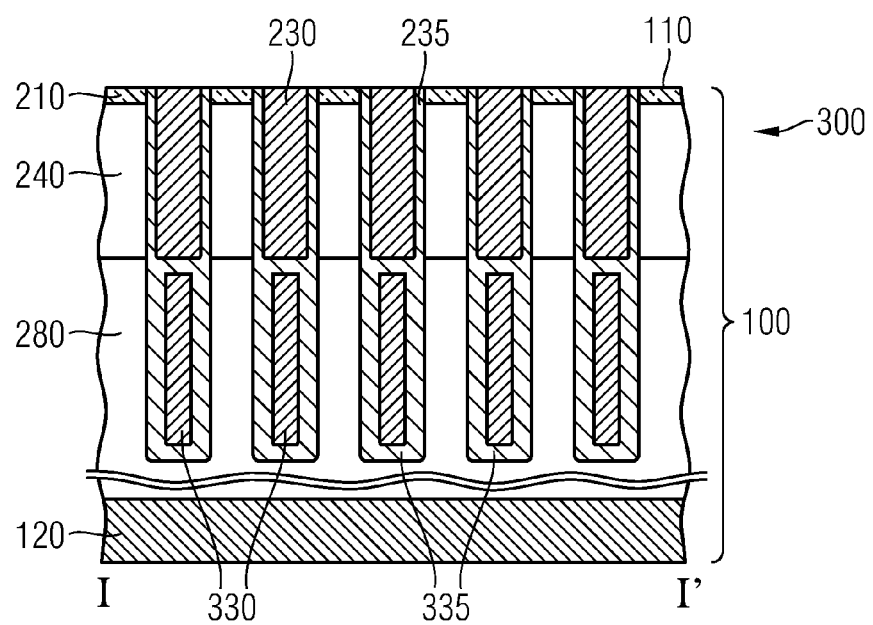
FIG. 3A shows a cross-sectional view of a semiconductor device according to a further embodiment.

FIG. 3A illustrates a cross-sectional view of a further embodiment of the semiconductor device. The semiconductor device of FIG. 3A comprises similar components as the semiconductor device illustrates FIGS. 2A to 2C. In addition, the transistor 300 shown in FIG. 3A comprises field plates 330 that are arranged in the gate trenches. The field plates 330 are insulated from the drain extension region 280 by means of a field dielectric 335 such as, for example, silicon oxide. The thickness of the field dielectric layer 335 may be larger than the thickness of the gate dielectric 235. According to the embodiment of FIG. 3A, the field plate 330 may be insulated from a gate electrode 230. For example, the gate electrode 230 and the field plate 330 may be made of doped polysilicon.

Figure 3B:
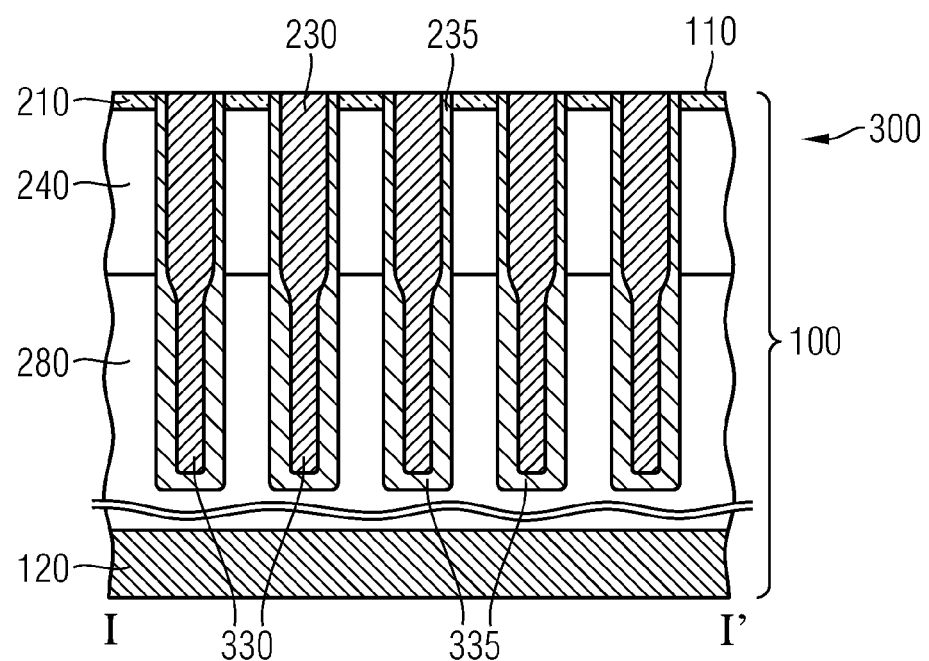
FIG. 3B shows a cross-sectional view of a semiconductor device according to a further embodiment.

According to the embodiment of FIG. 3B, the field plate 330 may be connected with the gate electrode 230 For example, the field plate 330 and the gate electrode 230 may be made from a single polysilicon layer. The further components of the transistor 300 shown in FIGS. 3A and 3B are similar to those of the transistor 200 illustrated in FIGS. 2A to 2C.

FIGS. 4A to 4D illustrate processes of manufacturing a semiconductor device according to an embodiment. For example, a starting point may be a substrate 405 of the first conductivity type. For example, the substrate 405 may be heavily doped, for example, with n-type dopants. On the surface of the substrate 405, a further layer 480 of the first conductivity type may be grown, for example, by epitaxy. The layer 480 may be doped with the first conductivity type at a lower doping concentration. Optionally, field oxide layers may be formed so as to separate the semiconductor device from further semiconductor devices. For example, the field oxide layer may be formed by a PECVD method or by a LOCOS process ("local oxidation of silicon"). Further processes may be performed in order to define active regions and perform etching steps. Then, a further layer is epitaxially grown. Thereafter, an ion implantation step is performed in order to provide the doped portion 440 with the second conductivity type. According to an embodiment, during this ion implantation step, portions of the substrate surface may be masked by a suitable mask so that only portions of the further layer are doped with the second conductivity type while other portions are doped with the first conductivity type. According to a further embodiment, the further layer may be in-situ doped with dopants of the second conductivity type to form the doped portion 440. Thereby, the body region 440 is formed. Alternatively, the body region 440 may be formed by epitaxially forming a layer that is doped with the second conductivity type. Optionally, further doped portions may be formed in the region of the pn junction (body diode) in order to further decrease a resistance in case of breakdown.

Thereafter, the clamping implant portion 490 is defined. For example, the portion in which the clamping doped portion 490 is to be formed may be defined by photolithography. Then, an implantation step with dopants of the second or first conductivity type is performed so as to form the clamping region 490 having a higher doping concentration than the body region 440. The clamping region 490 may be implemented in the manner explained above with reference to FIG. 2C.

Figure 4A:
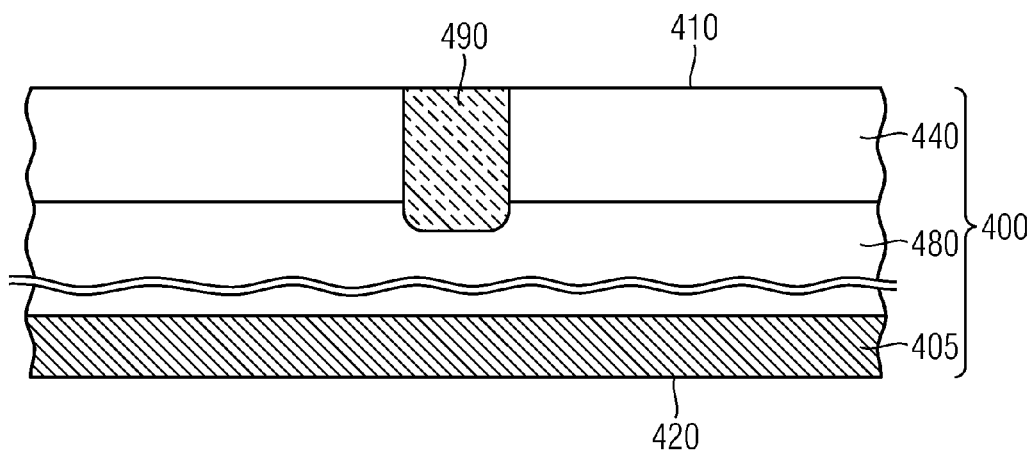
FIGS. 4A to 4D show cross-sectional views of a method of manufacturing a semiconductor device.

FIG. 4A shows an example of a resulting structure. As a result of the processing methods, a semiconductor substrate 400 has a first main surface 410 and a second main surface 420. A heavily doped portion of the first conductivity type 405 is disposed adjacent to the second main surface 420. A doped portion 440 of the second conductivity type is disposed adjacent to the first main surface 410. A doped portion 480 of the first conductivity type is disposed between region 440 and region 405. A clamping doped portion 490 is disposed in trenches formed in the first main surface 410.

Figure 4B:
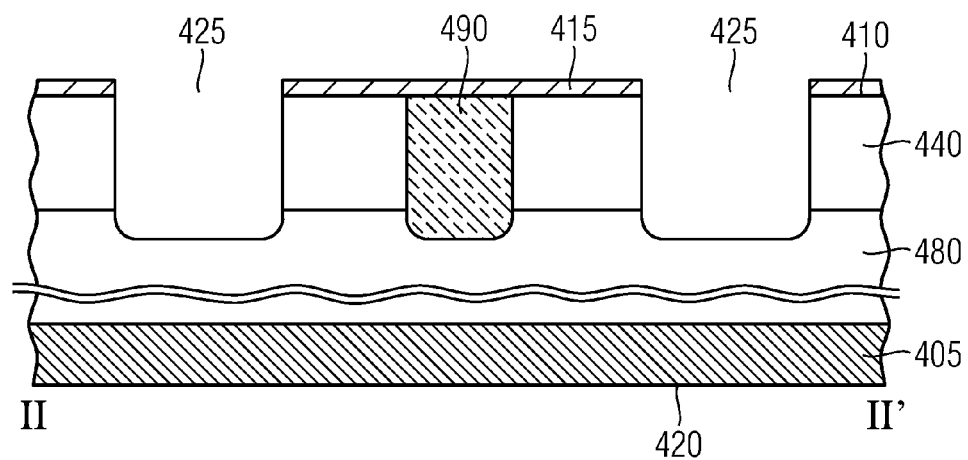

Thereafter, trenches 425 are defined so as to extend parallel to the direction of the cross-section illustrated in FIG. 4B. For example, the positions of the trenches 425 may be defined by photolithography, optionally using a hard mask layer 415 of a suitable material. The trenches 425 are etched as is conventional, for example, by dry etching. The trenches 425 extend to the doped region 480 of the first conductivity type. The trenches 425 may have a cross-sectional shape as illustrated in FIG. 2A, for example in the direction perpendicularly with respect to the illustrated cross-sectional view of FIG. 4B. The trenches 425 may have a depth of 0.5 to 1 μm. The trenches 425 may be etched so that a silicon body between adjacent trenches 425 has a thickness d of 50 to 100 nm.

Thereafter, an oxidation step may be performed in order to form the gate dielectric layer 435, followed by a step of depositing a polysilicon layer. Then, the polysilicon layer may be patterned, for example, by etching so that the polysilicon layer fills the trenches 425 to form the gate electrode 430. This process sequence implements a so-called damascene process according to which a gate electrode is formed by patterning a material in which the gate electrode is to be formed, followed by forming a gate material and etching back the gate material. Since the material in which the gate electrode is to be formed is patterned, the gate electrode is patterned.

Figure 4C:
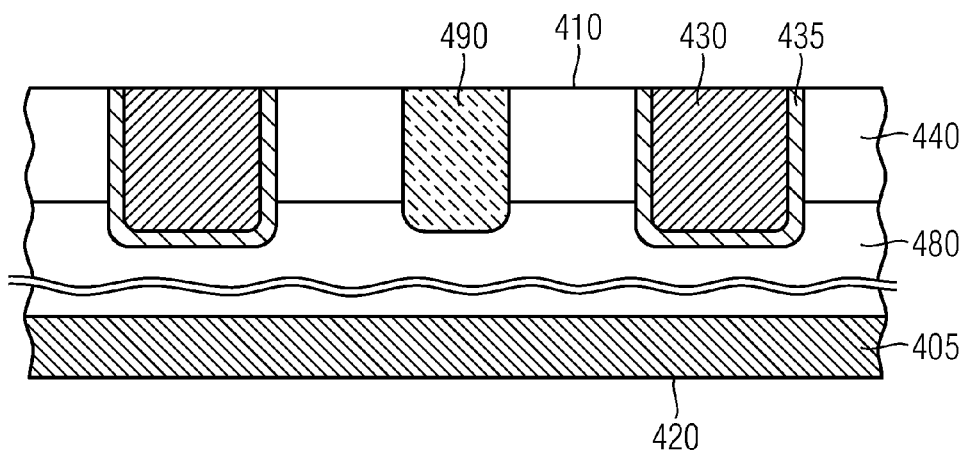
Figure 4D:
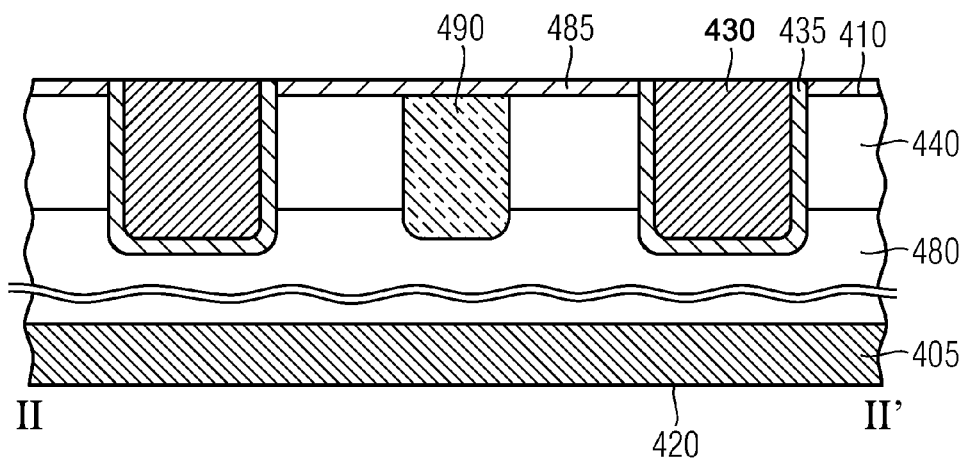

FIG. 4C shows an example of a resulting structure. As is shown, the gate electrode 430 is disposed within the trenches 425, the gate electrode 430 being insulated from adjacent silicon material by means of the gate dielectric layer 435.

Thereafter, implantation steps with dopants of the second conductivity type are performed in order to form the contact region 485. Further, an implantation method with dopants of the first conductivity type is performed so as to form the source region adjacent to the first main surface 410. The implantation with the dopants of the first conductivity type is performed at locations disposed before and behind the depicted drawing plane shown in FIG. 4D. For example, the positions at which the implantation is to be performed in the trench area may be defined by photolithography. Then, optionally, a silicon oxide layer may be formed, for example by PECVD using TEOS (tetraethylorthosilicate) as a starting material. In a next step, contacts may be formed to contact the source region and the gate electrode 430 and the contact portion 485 to a source terminal. For example, this may be accomplished by patterning the silicon oxide layer and forming a Ti/TiN layer, followed by forming a tungsten layer. Thereafter, further metallization layers for providing the source terminal, for example, may be formed. In addition, a back side metallization layer is formed so as to provide a drain terminal.

Figure 5:
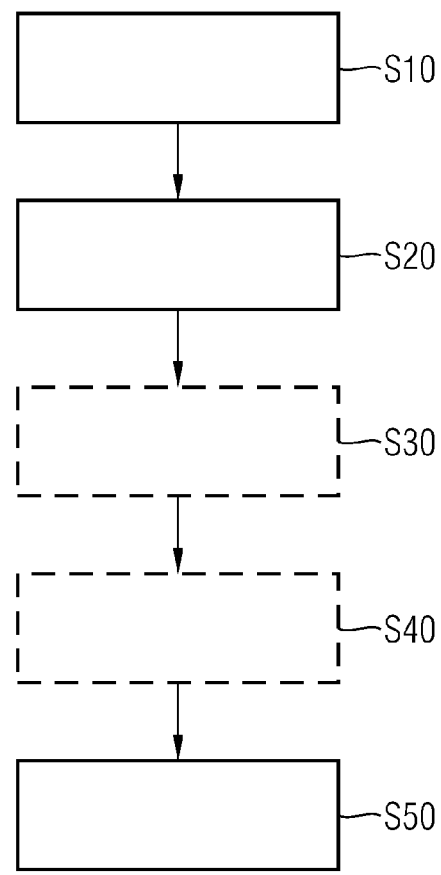
FIG. 5 shows a flowchart illustrating steps of a method of manufacturing a semiconductor device.

FIG. 5 illustrates components of a method of manufacturing a semiconductor device. A method of manufacturing a semiconductor device in a semiconductor substrate may comprise: forming a source region, a drain region and a gate electrode (S10); forming a body region between the source region and the drain region (S20), the source region and the drain region being doped with dopants of a first conductivity type, the body region being doped with dopants of a second conductivity type, wherein forming the gate electrode is accomplished so that the gate electrode is disposed adjacent at least two sides of the body region; and coupling the source region and the gate electrode to a source terminal (S50), wherein a width of the body region measured between said two sides is selected so that the body region is configured to be fully depleted. According to an embodiment, forming the gate electrode comprises etching trenches in the first main surface (S30) and filling a conductive material in the trenches (S40).

Figure 6:
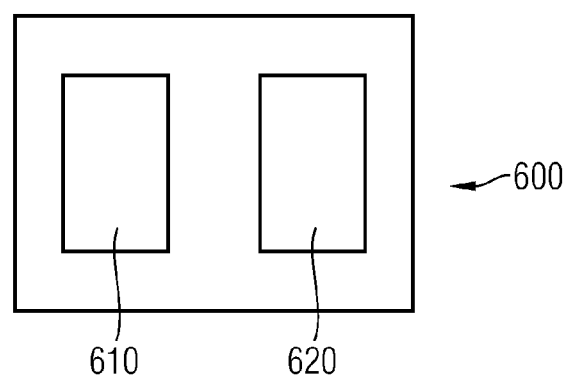
FIG. 6 shows an example of an integrated circuit.

FIG. 6 schematically illustrates an integrated circuit 600 according to an embodiment. The integrated circuit 600 may comprise a semiconductor device 610 as described previously herein and a further semiconductor device 620. Examples of the further semiconductor device 620 comprise any kind of power devices or further devices, for example, vertical power devices. According to a further embodiment, the further device 620 may be a second transistor in a manner as has been described above. For example, the semiconductor device of the present embodiments may be integrated with an MOSFET ("metal oxide semiconductor field effect transistor"). By way of example the semiconductor device of an embodiment may be integrated with an MOSFET being similar in structure. To be more specific, the MOSFET and the semiconductor device may comprise a transistor including a gate electrode and, optionally, a field plate that are disposed in trenches in a similar manner as has been explained above with reference to FIGS. 2A to 2C, 3A and 3B. According to a further example, the semiconductor device according to an embodiment may be used as a flyback diode that may be integrated with various further semiconductor devices. Examples of devices that may be integrated with the semiconductor device according to an embodiment comprise CMOS circuits, driver circuits, circuits including resistors, capacitors and others.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An integrated circuit comprising a first semiconductor device formed in a semiconductor substrate, the semiconductor device comprising:
a source region, a drain region, a gate electrode, and a body region disposed between the source region and the drain region,
the source region and the drain region being doped with dopants of a first conductivity type, the body region being doped with dopants of a second conductivity type,
the source region being disposed adjacent to a first main surface of the semiconductor substrate, the drain region being disposed adjacent to a second main surface of the semiconductor substrate, and the body region extending in a direction intersecting the first main surface,
the gate electrode being disposed in trenches extending into the semiconductor substrate at the first main surface, the trenches being arranged along a first direction parallel to the first main surface,
the gate electrode being configured to control a conductivity of a conductive channel formed in the body region,
the body region being disposed between adjacent trenches,
the source region and the gate electrode being electrically connected to a source terminal, and
a second semiconductor device formed in the semiconductor substrate, the second semiconductor device comprising:
a second source region, a second drain region, a second gate electrode, and a second body region disposed between the second source region and the second drain region,
the second source region and the second drain region being doped with dopants of a first conductivity type,
the second body region being doped with dopants of a second conductivity type,
the second source region being disposed adjacent to the first main surface of the semiconductor substrate, the second drain region being disposed adjacent to the second main surface of the semiconductor substrate, and the second body region extending in a direction intersecting the first main surface,
the second gate electrode being disposed in second trenches arranged in the first main surface,
the second source region and the second gate electrode being coupled to the source terminal,
the second semiconductor device being shifted with respect to the first semiconductor device along a second direction perpendicular to the first direction, and
a doped portion of the second conductivity type being arranged between the first semiconductor device and the second semiconductor device.

2. The integrated circuit of claim 1, further comprising a clamping portion doped with dopants of the first or second conductivity type at a higher concentration than the doped portion between the first and the second semiconductor device.

3. The integrated circuit of claim 1, further comprising a further semiconductor device in the semiconductor substrate.

4. The integrated circuit according to claim 1, further comprising a field plate disposed in a bottom portion the trenches and insulated from the semiconductor substrate by a field dielectric layer.

5. The integrated circuit according to claim 4, further comprising a further semiconductor device in the semiconductor substrate, the further semiconductor device comprising further trenches, wherein a field plate and a gate electrode of the further semiconductor device is disposed in the further trenches.

6. The integrated circuit according to claim 1, wherein the distance d between adjacent trenches corresponds to a width of the body region and a ratio of a length to the width of the body region is larger than 2.5, the length being measured along a current path in an extension direction of the gate electrode.

7. The integrated circuit according to claim 1,
wherein the source region and the drain region are doped with dopants of a first conductivity type, the body region is doped with dopants of a second conductivity type,
the integrated circuit further comprising a drain extension region doped with dopants of the first conductivity type, the drain extension region being disposed between the body region and the drain region.

8. The integrated circuit according to claim 1, wherein the body region is coupled to the source terminal.

9. The integrated circuit according to claim 1, wherein a thickness of a gate dielectric layer between the gate electrode and the body region is more than 10 nm.

10. The integrated circuit according to claim 3, wherein the further device is selected from the group consisting of a MOSFET, a flyback diode, a driver circuit, and a CMOS circuit.

\* \* \* \* \*

UNITED STATES PATENT AND TRADEMARK OFFICE
CERTIFICATE OF CORRECTION

PATENT NO. : 9,620,637 B2  
APPLICATION NO. : 13/902151  
DATED : April 11, 2017  
INVENTOR(S) : A. Meiser et al.

Page 1 of 1

It is certified that error appears in the above-identified patent and that said Letters Patent is hereby corrected as shown below:

In the Claims

Column 10, Line 53 (Claim 4, Line 2) please change "portion the" to -- portion of the --

Signed and Sealed this  
Eleventh Day of July, 2017

Joseph Matal  
*Performing the Functions and Duties of the*  
*Under Secretary of Commerce for Intellectual Property and*  
*Director of the United States Patent and Trademark Office*